(12) United States Patent
Nishida

(10) Patent No.: US 9,168,561 B2
(45) Date of Patent: Oct. 27, 2015

(54) APPARATUS INCLUDING A FIXED TEMPORARY STAGE FOR MANUFACTURING MOLDED PRODUCT

(71) Applicant: THE JAPAN STEEL WORKS, LTD., Tokyo (JP)

(72) Inventor: Shoso Nishida, Hiroshima (JP)

(73) Assignee: THE JAPAN STEEL WORKS, LTD., Tokyo (JP)

( * ) Notice: Subject to any disclaimer, the term of this patent is extended or adjusted under 35 U.S.C. 154(b) by 1 day.

(21) Appl. No.: 13/655,777

(22) Filed: Oct. 19, 2012

(65) Prior Publication Data
US 2013/0101740 A1    Apr. 25, 2013

(30) Foreign Application Priority Data
Oct. 20, 2011 (JP) ................................. 2011-230932

(51) Int. Cl.
*B05C 13/00* (2006.01)
*B05C 13/02* (2006.01)
(Continued)

(52) U.S. Cl.
CPC ............. *B05C 13/02* (2013.01); *B05B 13/0221* (2013.01); *B29C 45/0053* (2013.01); *B29C 45/14336* (2013.01); *C23C 14/00* (2013.01); *B29C 2045/0079* (2013.01)

(58) Field of Classification Search
CPC ........ C23C 14/50; C23C 14/34; B05C 13/00; B05C 13/025; B05C 15/00; B05C 9/08; B29C 49/4205; B29C 49/6409; B29C 45/0433; B29C 45/7207; B05B 13/0221; B05B 13/0264; B05B 13/0609; B05D 2507/00; B05D 7/02; B05D 2201/00
USPC ............ 264/453, 423, 516, 602, 671; 425/90, 425/DIG. 1, DIG. 201, DIG. 108, DIG. 638; 118/64, 629, 630, 322, 324, 500, 502, 118/503
See application file for complete search history.

(56) References Cited

U.S. PATENT DOCUMENTS 4,880,792 A * 11/1989 Yoshioka et al. ............. 425/190
5,024,570 A *  6/1991 Kiriseko et al. .......... 414/222.06
(Continued)

FOREIGN PATENT DOCUMENTS

JP    03262620 A  * 11/1991  .............. B29C 45/17
JP    2000113529 A    4/2000
(Continued)

OTHER PUBLICATIONS

Notification of Reasons for Refusal, dated Aug. 20, 2013, issued by the Japanese Patent Office in counterpart Japanese Application No. 2011-230932.

*Primary Examiner* — Dah-Wei Yuan
*Assistant Examiner* — Karl Kurple
(74) *Attorney, Agent, or Firm* — Sughrue Mion, PLLC

(57) ABSTRACT

An apparatus for manufacturing a molded product, which has a highly homogeneous thin film, at low cost by operating an injection molding machine and a film forming device at a high rate of operation is provided. A molded product formed by an injection molding machine is conveyed to a temporary stage by a first conveying device. The molded products corresponding to several times of an injection molding step are pooled on the temporary stage by the repetition of an injection molding step. A second conveying device collectively conveys all the molded products, which are pooled on the temporary stage, to a film forming device. Films are formed on the molded products by the film forming device, and the molded products are conveyed to the outside by a third conveying device. The injection molding step is continuously performed while a film forming step is performed.

1 Claim, 3 Drawing Sheets

(51) Int. Cl.
*B05B 13/02* (2006.01)
*B29C 45/00* (2006.01)
*C23C 14/00* (2006.01)
*B29C 45/14* (2006.01)

(56) References Cited

U.S. PATENT DOCUMENTS

| | | | | |
|---|---|---|---|---|
| 5,039,299 A * | 8/1991 | Hehl | | 425/556 |
| 5,061,169 A * | 10/1991 | Yamashiro et al. | | 425/190 |
| 5,102,610 A * | 4/1992 | Koga | | 264/532 |
| 5,213,822 A * | 5/1993 | Koga | | 425/522 |
| 5,443,360 A * | 8/1995 | Lamb et al. | | 414/799 |
| 5,468,443 A * | 11/1995 | Takada et al. | | 264/537 |
| 5,603,777 A * | 2/1997 | Ohashi | | 134/25.4 |
| 5,772,951 A * | 6/1998 | Coxhead et al. | | 264/537 |
| 5,846,328 A * | 12/1998 | Aruga et al. | | 118/718 |
| 5,980,184 A * | 11/1999 | Lust et al. | | 414/226.01 |
| 6,235,634 B1 * | 5/2001 | White et al. | | 438/680 |
| 6,516,234 B2 | 2/2003 | Kamiguchi et al. | | 700/20 |
| 6,676,810 B2 * | 1/2004 | Parent | | 204/192.1 |
| 6,708,385 B1 | 3/2004 | Lemelson | | 29/563 |
| 6,878,316 B1 * | 4/2005 | Cochran et al. | | 264/40.1 |
| 7,204,943 B2 * | 4/2007 | Cochran et al. | | 264/40.1 |
| 7,343,660 B1 | 3/2008 | Lemelson | | 29/563 |
| 8,025,473 B2 * | 9/2011 | Asakawa | | 414/221 |
| 8,136,475 B2 * | 3/2012 | Davis et al. | | 118/301 |
| 8,590,482 B2 * | 11/2013 | Nishihara et al. | | 118/425 |
| 8,622,682 B2 * | 1/2014 | Murata et al. | | 414/281 |
| 8,646,404 B2 * | 2/2014 | Hendricks, Sr. | | 118/503 |
| 8,656,858 B2 * | 2/2014 | Schneider | | 118/423 |
| 8,677,929 B2 * | 3/2014 | Berger et al. | | 118/423 |
| 2001/0008983 A1 * | 7/2001 | Yotsumoto et al. | | 700/230 |
| 2002/0065571 A1 * | 5/2002 | Kamiguchi et al. | | 700/96 |
| 2003/0102602 A1 * | 6/2003 | Miura | | 264/489 |
| 2003/0219507 A1 * | 11/2003 | Burkle et al. | | 425/587 |
| 2003/0231576 A1 * | 12/2003 | Usami | | 369/272 |
| 2004/0232574 A1 | 11/2004 | Usami | | |
| 2007/0108254 A1 | 5/2007 | Kobayashi et al. | | |
| 2008/0029023 A1 | 2/2008 | Ikeda et al. | | |
| 2010/0008749 A1 * | 1/2010 | Spangler et al. | | 414/222.13 |
| 2010/0181193 A1 * | 7/2010 | Parent et al. | | 204/298.26 |
| 2010/0326354 A1 * | 12/2010 | Sahoda et al. | | 118/712 |
| 2011/0091589 A1 * | 4/2011 | Yamamoto et al. | | 425/3 |
| 2012/0145073 A1 * | 6/2012 | Fukutomi et al. | | 118/58 |
| 2012/0160669 A1 * | 6/2012 | Ito et al. | | 204/298.02 |
| 2013/0056913 A1 * | 3/2013 | Forsthoevel | | 264/535 |
| 2013/0328249 A1 * | 12/2013 | Klausriegler | | 264/537 |
| 2014/0077410 A1 * | 3/2014 | Takatsugi et al. | | 264/161 |

FOREIGN PATENT DOCUMENTS

| | | | | |
|---|---|---|---|---|
| JP | 2001143330 A | 5/2001 | | |
| JP | 2002245689 A | 8/2002 | | |
| JP | 2002288888 A | 10/2002 | | |
| JP | 200450631 A | 2/2004 | | |
| JP | 2005158883 A | 6/2005 | | |
| JP | 3677033 B2 | 7/2005 | | |
| JP | 200812727 A | 1/2008 | | |
| JP | 2011-058048 A | 3/2011 | | |
| JP | 201158048 A | 3/2011 | | |
| JP | 2011058048 | * | 3/2011 | C23C 14/34 |
| JP | 2011189695 A | 9/2011 | | |
| WO | 2004-101254 A1 | 11/2004 | | |
| WO | 2005111263 A1 | 11/2005 | | |

* cited by examiner

APPARATUS INCLUDING A FIXED TEMPORARY STAGE FOR MANUFACTURING MOLDED PRODUCT

This application claims priority from Japanese Patent Application No. 2011-230932 filed on Oct. 20, 2011, the entire subject-matter of which is incorporated herein by reference.

BACKGROUND OF THE INVENTION

1. Field of the Invention

The present invention relates to a method and an apparatus for manufacturing a molded product having a thin film, and the method and the apparatus form a molded product made of a resin by injection molding, convey the molded product to a film formation chamber, and form a thin film on a predetermined surface of the molded product.

2. Description of the Related Art

Examples of a molded product, which has a thin film having a thickness of the order of 0.1 to several μm on a part of the surface thereof, include a front lamp provided on an automobile, a CD/DVD on which digital data are recorded, a transparent electrode of a liquid crystal display, and a toy having a metallic luster. These molded products having thin films are formed as follows: a molded product, which becomes a base material, is injection-molded by an injection molding machine; the molded product is carried into a film forming device as a workpiece, on which a film is to be formed; and a film is formed on the molded product. Not only the injection molding machine but also the film forming device has also been known. There are various kinds of injection molding machines, such as an injection molding machine including a toggle type mold clamping device and an injection molding machine including a direct pressure type mold clamping device, but the injection molding machine basically includes a pair of molds, a mold clamping device, an injection device, and the like. Accordingly, the pair of molds are clamped by the mold clamping device, and a resin as a material is melted in the injection device, and a molten resin is injected into cavities formed in the molds. After the molten resin is solidified by cooling, the mold clamping device is driven so that the pair of molds are opened. Accordingly, molded products are obtained.

The film forming device includes a film formation chamber. Incidentally, various kinds of film forming devices are provided according to a film forming method. For example, a sputtering method, an ion-plating method, a plasma film forming method and the like are known as film forming methods. The sputtering method is of forming a thin film by disposing a target material so that the target material faces the surface of a workpiece, on which a film is to be formed, applying a negative voltage in the range of several hundred V to several kV to the target material in an argon gas atmosphere with a pressure of about several to several tens of Pa, and discharging electricity; an electron beam deposition method of forming a film on the surface of a workpiece, on which a film is to be formed, by irradiating a target material with an electron beam, which is generated from an electron gun, in a vacuum chamber so as to evaporate the target material through heating. The ion-plating method is of performing vacuum deposition on a workpiece, on which a film is to be formed, under the pressure of an argon gas of several Pa by applying a negative voltage in the range of several hundred V to several kV to the workpiece. Further, a chemical vapor deposition method is also known as a film forming method. Compound targets, such as an oxide, a nitride, and a carbide, are known as the target material used in these film forming methods, and a metal target, a powder target, and the like are also known as the target material. There are various kinds of film forming methods as described above, and film forming devices suitable for the respective film forming methods are provided.

Incidentally, if dirt from the hands or dust adheres to the molded product when a film is formed on a molded product, it is not possible to appropriately form a film and unevenness also occurs on a thin film to be formed on the molded product. Accordingly, when the molded product, which has been formed by injection molding, is conveyed to the film forming device, it is necessary to prevent dirt from the hands or dust from adhering to the molded product. Further, immediately after the molded product is formed, the temperature of the molded product is high. However, when heat is reduced after the molded product is left, moisture is adsorbed in the molded product. If moisture is adsorbed in the molded product, hindrance occurs when air is sucked from the film formation chamber and the quality of a thin film to be formed deteriorates. For this reason, it is necessary to evaporate moisture adsorbed in the molded product by heating the molded product in advance when forming a film.

Japanese Patent No. 3677033 discloses an apparatus for manufacturing a molded product having a thin film that covers the inner surface of one semi-hollow body of a pair of semi-hollow bodies molded by a stationary mold and a movable mold, that is, the surface of a molded product with a film forming chamber that is provided with deposition elements, such as a target electrode, a substrate electrode, and a vacuum suction pipe, and performs deposition, that is, the formation of a film in the stationary mold while the semi-hollow bodies remain on the stationary mold. JP-A-2011-58048 discloses an apparatus for manufacturing a molded product having a thin film that includes an injection molding machine conveying a molded product formed by the injection molding machine to a film forming device while keeping the molded product warm by a heater, a film forming device, and a conveying device.

SUMMARY OF THE INVENTION

According to the apparatus disclosed in Japanese Patent No. 3677033, it may be possible to form a film by using the film forming chamber, which is provided in the mold, without taking out the molded product from the mold where injection molding is performed. Accordingly, the molded product may not be contaminated with dirt from the hands, dust, or the like, and the adsorption of moisture may not occur since the temperature of the molded product is sufficiently high. Therefore, it may be possible to easily suck air from the film forming chamber, so that it may be possible to obtain a molded product having a high-quality thin film. Even in the apparatus disclosed in JP-A-2011-58048, the molded product, which has been formed by injection molding, is conveyed to the film forming device by the conveying device. Thus, the molded product may not be contaminated with dirt from the hands, dust, or the like. Further, since the molded product is kept warm by the heater while being conveyed, the adsorption of moisture may not occur. Accordingly, it may be possible to easily suck air from the film forming device, so that it may be possible to obtain a molded product having a high-quality thin film.

However, portions to be improved are also recognized in Japanese Patent No. 3677033 and JP-A-2011-58048. Specifically, first, there is a problem in that it is not possible to sufficiently increase efficiency, because the time required for injection molding is different from the time required for forming a film. When a molded product is obtained from injection molding, for example, 10 to 30 seconds are required. Accordingly, it may be possible to form the molded product in a short time. However, one minute or more are required in order to form a film by the film forming device. For this reason, since a waiting time is caused by the injection molding machine even though injection molding and the formation of a film are performed in parallel in the respective apparatuses disclosed in Japanese Patent No. 3677033 and JP-A-2011-58048, the rate of operation of the injection molding machine is low. That is, since it is not possible to increase efficiency, costs are increased. The apparatus disclosed in Japanese Patent No. 3677033 also has an inherent problem. That is, since an opening portion of the film forming chamber should come into close contact with the parting surface of the mold so that a vacuum chamber is formed in the mold, a problem of sealing is recognized in this apparatus. Since the degree of vacuum affects the quality of a product, high sealing performance is required. However, since the film forming chamber is apt to be affected by the mold, the sealing performance of the film forming chamber is also affected when the temperature of the mold is changed. That is, there is no guarantee that high sealing performance is ensured. In terms of sealing performance, it may be preferable that the molded product formed by the molds be conveyed to the film forming device provided outside the molds and a film be formed on the molded product. The apparatus disclosed in JP-A-2011-58048 also has an inherent problem. That is, this apparatus is particularly provided with the heater to keep the molded product warm while conveying the molded product. However, in general, the temperature of the molded product is sufficiently high immediately after the molded product is formed. Accordingly, the adsorption of moisture does not substantially occur. For this reason, energy supplied to the heater is wasted.

Accordingly, illustrative aspects of the invention provide a method and an apparatus for manufacturing a molded product having a thin film that can obtain a molded product on which a high-quality film has been formed since dirt from the hands or dust does not adhere to the molded product on which a film has been formed or moisture is not adsorbed in the molded product and can reduce the costs of the molded product on which a film has been formed since being capable of operating an injection molding machine and a film forming device at a high rate of operation.

According to an aspect of the invention, a molded product having a thin film is manufactured by an apparatus including an injection molding machine that forms a molded product, first to third conveying devices that convey the molded product, a film forming device that forms a film on the molded product, and a predetermined temporary stage that pools the molded products. When the molded product is formed by the injection molding machine, the molded product is conveyed to the temporary stage by the first conveying device and is pooled on the temporary stage. This conveyance is performed whenever injection molding is performed. The molded products pooled on the temporary stage are collectively conveyed to the film forming device by the second conveying device, and films are formed on the molded products by the film forming device. The molded products on which the films have been formed are conveyed to the outside from the film forming device by the third conveying device. Incidentally, the molded product is conveyed to the film forming device before the surface temperature of the molded product falls to 40° C. or less.

That is, according to a first illustrative aspect of the invention, there is provided a method for manufacturing a molded product having a thin film, the method comprising: an injection molding step of forming a molded product by an injection molding machine; a conveying step of conveying the molded product by a conveying device; and a film forming step of forming a film on the molded product by a film forming device, wherein the conveying step comprises: a first conveying step of conveying the molded product to a predetermined molded product pool area from the injection molding machine whenever the injection molding step is performed one time; a second conveying step of conveying the molded products, which are formed by performing the injection molding step several times and pooled in the molded product pool area, to the film forming device; and a third conveying step of conveying the molded products, on which the films have been formed by the film forming device, to the outside, wherein the second conveying step conveys the molded product to the film forming device before the surface temperature of the molded product falls to 40° C. or less, and wherein the film forming step collectively forms films on the molded products that are formed by performing the injection molding step several times.

According to a second illustrative aspect of the invention, the second conveying step conveys all the molded products, which are pooled in the molded product pool area, to the film forming device.

According to a third illustrative aspect of the invention, there is provided an apparatus for manufacturing a molded product having a thin film, the apparatus comprising: an injection molding machine configured to form a molded product; first to third conveying devices configured to convey the molded product; a film forming device configured to form a film on the molded product; and a temporary stage configured to pool the molded products, wherein the molded product formed by the injection molding machine is conveyed to the temporary stage in every shot of the injection molding machine by the first conveying device, wherein the molded products, which are formed by a plurality of shots and pooled on the temporary stage, are conveyed to the film forming device by the second conveying device before the surface temperature of the molded product falls to 40° C. or less, and films are collectively formed on the molded products by the film forming device, and wherein the molded products, on which the films have been formed by the film forming device, are conveyed to the outside by the third conveying device.

According to a fourth illustrative aspect of the invention, all the molded products pooled on the temporary stage are conveyed to the film forming device by the second conveying device.

As described above, one illustrative aspect of the invention provides the method for manufacturing a molded product having a thin film including an injection molding step of forming a molded product by an injection molding machine, a conveying step of conveying the molded product by a conveying device, and a film forming step of forming a film on the molded product by a film forming device. Accordingly, since the molded product on which the film has been formed is conveyed by the conveying device, dirt from the hands or dust does not adhere to the molded product. Further, according to the aspect of the invention, the conveying step includes a first conveying step of conveying the molded product to a predetermined molded product pool area from the injection molding machine whenever the injection molding step is performed one time; a second conveying step of conveying the molded products, which are formed by performing the injection molding step several times and pooled in the molded product pool area, to the film forming device; and a third conveying step of conveying the molded products, on which the films have been formed by the film forming device, to the outside. The second conveying step conveys the molded product to the film forming device before the surface temperature of the molded product falls to 40° C. or less. Accordingly, since the temperature of the surface of the molded product on which a film is formed is sufficiently high, moisture is not adsorbed in the surface of the molded product. Since dirt from the hands or dust does not adhere to the molded product and moisture is not adsorbed in the molded product as described above, it is easy to suck air from the film forming device and it is possible to form a high-quality thin film. Further, according to the aspect of the invention, the film forming step collectively forms films on the molded products that are formed by performing the injection molding step several times. The time for required for the film forming step is longer than the time required for the injection molding step, and needs to be, for example, two to six times or more of the time required for the injection molding step. However, since the film forming step collectively forms films on the molded products formed by performing the injection molding step several times as described above, not only the rate of operation of the film forming device but also the rate of operation of the injection molding machine is high. Accordingly, it is possible to manufacture a molded product having a thin film at low cost.

Another illustrative aspect of the invention provides an apparatus for manufacturing a molded product having a thin film, the apparatus including an injection molding machine that forms a molded product, first to third conveying devices that convey the molded product, a film forming device that forms a film on the molded product, and a predetermined temporary stage that pools the molded product. Accordingly, the apparatus is formed as a simple apparatus. Further, the molded product formed by the injection molding machine is conveyed to the temporary stage in every shot of the injection molding machine by the first conveying device; the molded products, which are formed by a plurality of shots and pooled on the temporary stage, are conveyed to the film forming device by the second conveying device before the surface temperature of the molded product falls to 40° C. or less, and films are collectively formed on the molded products by the film forming device; and the molded products, on which the films have been formed by the film forming device, are conveyed to the outside by the third conveying device. That is, since the temporary stage is provided, it is possible to pool the molded products formed by the injection molding machine and to collectively form films on the pooled molded products by the film forming device. Accordingly, it is possible to achieve not only the high rate of operation of the injection molding machine but also the high rate of operation of the film forming device. Since the apparatus is simple as a whole although the apparatus can achieve a high rate of operation as described above, an advantage of being capable of providing the apparatus at low cost is obtained.

DETAILED DESCRIPTION OF THE PREFERRED EMBODIMENTS

Figure 2A:
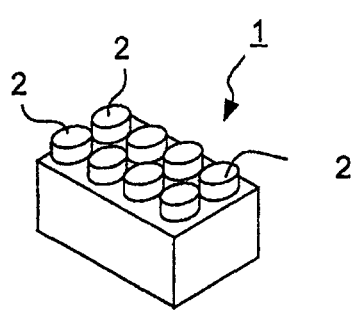
FIG. 2A is a perspective view of the molded product having a thin film according to the exemplary embodiment of the invention.

Exemplary embodiments of the invention will be described below. A molded product 1 having a thin film, which is manufactured by an apparatus according to an exemplary embodiment of the invention, is a so-called block toy, in which a desired structure can be formed by the joining of a plurality of molded products 1. As shown in FIG. 2A, the molded product 1 having a thin film is formed in the shape of a rectangular parallelepiped and protrusions 2 are formed on the upper surface of the rectangular parallelepiped. The molded product can be joined to another molded product 1 by these protrusions 2. The molded product 1 is made of a resin and formed by injection molding, and a film is formed on the molded product by a film forming device. Accordingly, the molded product 1 has metallic luster.

Figure 1:
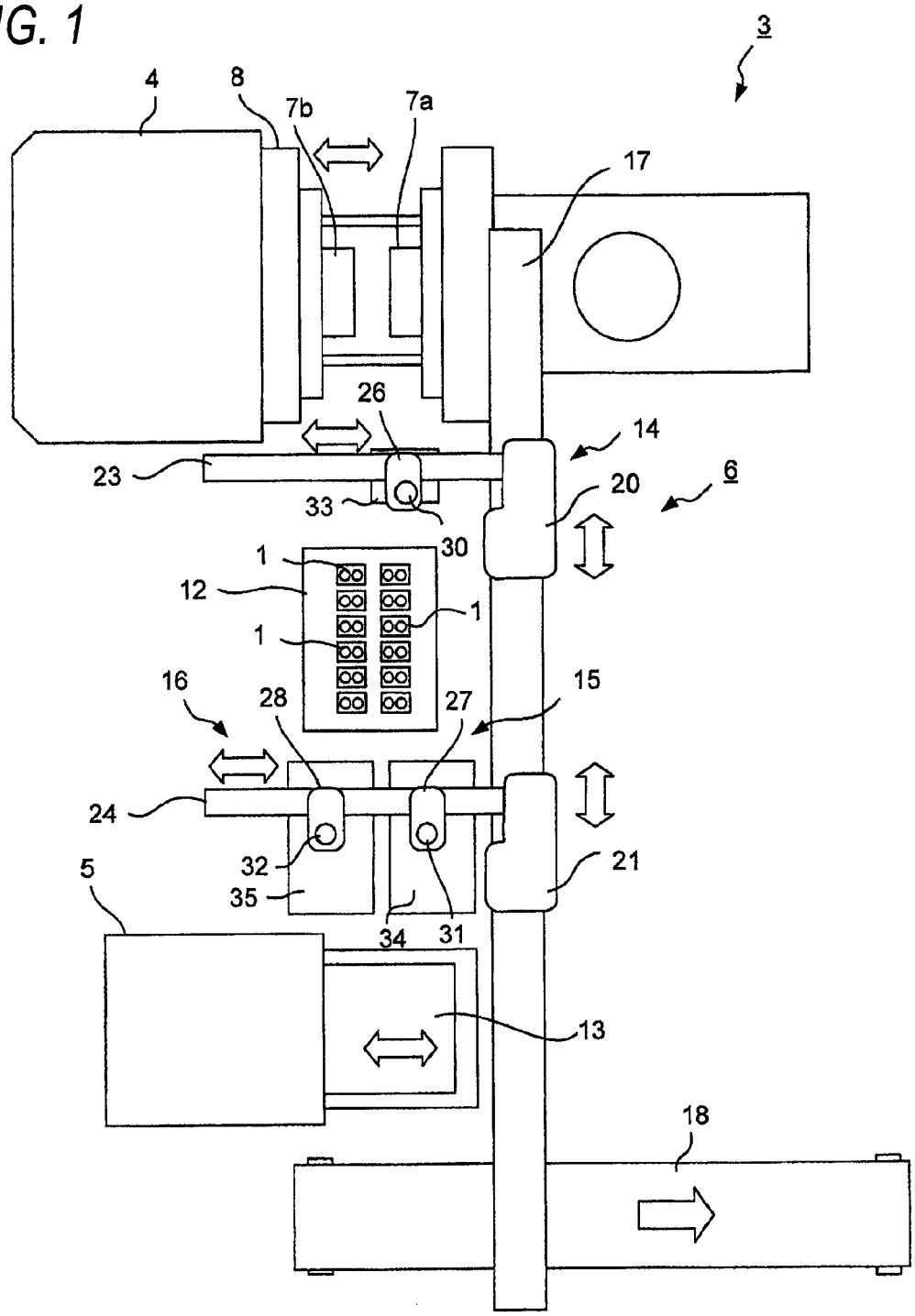
FIG. 1 is a plan view schematically showing an apparatus for manufacturing a molded product having a thin film according to an exemplary embodiment of the invention.

As schematically shown in FIG. 1, the configuration of a part of an apparatus 3 for manufacturing a molded product having a thin film according to the exemplary embodiment of the invention is different from that of an apparatus for manufacturing a molded product in the related art, but the apparatus 3 has substantially the same configuration as the apparatus in the related art. That is, the apparatus 3 includes an injection molding machine 4, a film forming device 5, a conveying device 6 that conveys molded products, and the like.

Figure 2B:
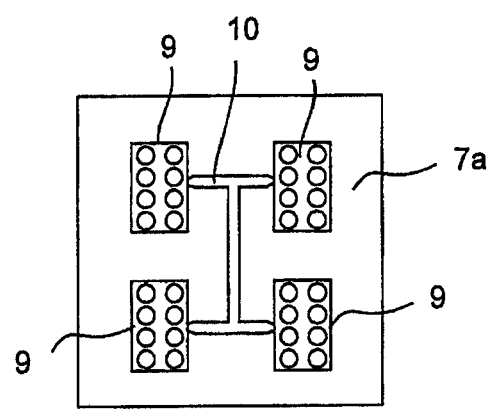
FIG. 2B is a plan view of a mold that is used to mold the molded product.

Each of the injection molding machine 4 and the film forming device 5 are known in the art, so that they will be roughly described. There are various kinds of injection molding machines, such as an injection molding machine including a toggle type mold clamping device and an injection molding machine including a direct pressure type mold clamping device, as the injection molding machine 4 and any type of injection devices, such as a screw type injection device and a plunger type injection device, may be employed as an injection device. In this exemplary embodiment, a toggle type injection molding machine that includes a screw type injection device is provided as the injection molding machine 4. That is, the injection molding machine 4 includes a pair of molds 7a and 7b, a toggle type mold clamping device 8 that clamps these molds 7a and 7b, an injection device that melts a resin as a material and injects the resin to the clamped molds 7a and 7b, and the like. Since being covered with a protective cover, a part of the toggle type mold clamping device 8 and the injection device are not shown in FIG. 1. The mold 7a of this exemplary embodiment is schematically shown in FIG. 2B. The mold 7a is provided with four cavities 9 that are used to form molded products 1 and a runner 10 that is used to supply a molten resin to these cavities 9. Accordingly, four molded products 1 can be simultaneously formed by a single injection molding step. The injection molding machine 4 of this exemplary embodiment can perform one injection molding per 20 seconds. Therefore, since the injection molding machine 4 can perform an injection molding step three times per one minute, twelve molded products 1 can be formed per one minute.

The film forming device 5 may be formed of a known device, such as a sputtering film forming device, an electron beam deposition device, or an ion-plating film forming device. Further, as the sputtering film forming device, there are various kinds of sputtering film forming devices, such as a DC type film forming device, a high frequency type film forming device, and a magnetron type film forming device. Although the inside of the apparatus is not shown in FIG. 1, when the film forming device 5 is formed of a DC type sputtering film forming device, the film forming device 5 includes a film formation chamber, a film formation stage that is provided below the film formation chamber and loaded with molded products, a target electrode that is provided above the film formation stage so as to face the film formation stage, a target that is provided on the target electrode, a DC power source that supplies a DC voltage to the target electrode, a vacuum source that sucks air from the film formation chamber, an inert gas tank or an inert gas supply source that supplies an inert gas such as a carbon dioxide gas to the film formation chamber, and the like. Incidentally, the film forming device 5 is provided with a conveying stage 13 that can slide into and out of the film formation chamber. Thus, the film forming device 5 is loaded with molded products and is configured to convey the molded products into the film formation chamber or to convey molded products on which films have been formed in the film formation chamber to the outside. In this exemplary embodiment, the conveying stage 13 is formed of the above-described film formation stage. The film formation stage is relatively large, such that the film forming device 5 of this exemplary embodiment is loaded with twelve molded products 1 and can collectively form films on the molded products. The time required for the film forming device 5 of this exemplary embodiment to perform a single film forming step is substantially one minute.

The apparatus 3 for manufacturing a molded product having a thin film according to this exemplary embodiment is provided with a device or a member that is specific to this exemplary embodiment. That is, the apparatus 3 is provided with a pool area where molded products are pooled, that is, a temporary stage 12. The temporary stage 12 is disposed between the injection molding machine 4 and the film forming device 5. Molded products that are formed by the injection molding machine 4 are placed on the temporary stage 12. In this exemplary embodiment, the temporary stage 12 can pool twelve molded products 1.

Figure 3:
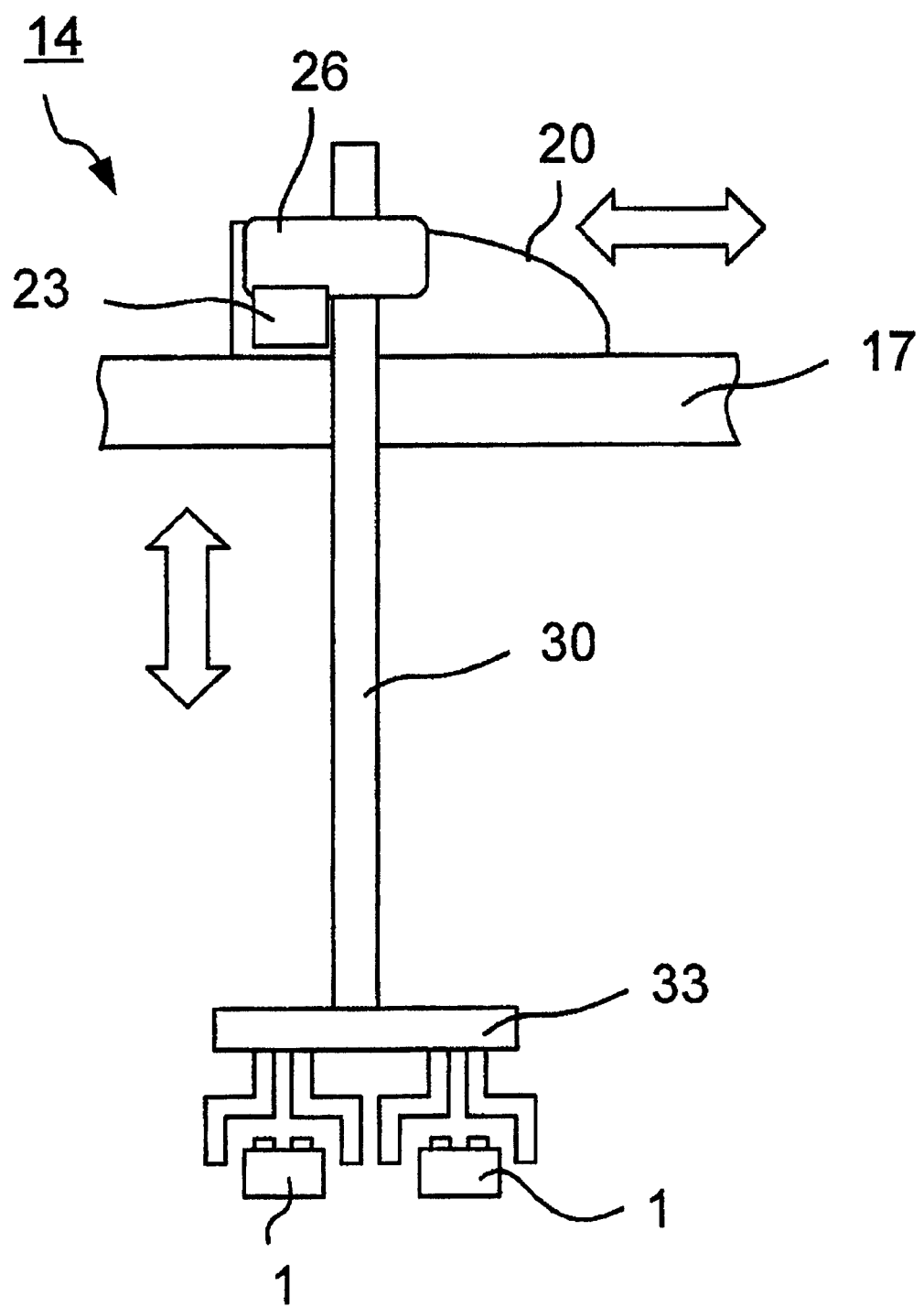
FIG. 3 is a front view showing a part of a conveying device of the apparatus for manufacturing a molded product having a thin film according to the exemplary embodiment of the invention.

The conveying device 6 of this exemplary embodiment is configured to convey the molded products 1 formed by the injection molding machine 4 to the temporary stage 12 or to convey the molded products 1 pooled on the temporary stage 12 to the film forming device 5. The conveying device 6 includes a plurality of conveying devices 14, 15, and 16. However, since a rail along which these conveying devices 14, 15, and 16 slide is shared as a main rail 17, the conveying devices 14, 15, and 16 are similar to one conveying device as a whole. The main rail 17 is provided above the injection molding machine 4, the temporary stage 12, and the film forming device 5. One end portion of the main rail 17 is positioned at the injection molding machine 4, and a portion of the main rail 17 near the other end portion of the main rail 17 is positioned at the film forming device 5. A belt conveyor 18 is configured to convey the molded products 1 on which films have been formed to the outside. The belt conveyor 18 is provided beside the film forming device 5. The other end portion of the main rail 17 is positioned above the belt conveyor 18. First and second main slide devices 20 and 21 are slidably provided on the main rail 17 near the injection molding machine 4 and the film forming device 5, respectively. First and second transverse rails 23 and 24, which are orthogonal to the main rail 17 and extend in the horizontal direction, are fixed to these first and second main slide devices 20 and 21, respectively. A first transverse slide device 26, which slides on the first transverse rail 23, is provided on the first transverse rail 23 and second and third transverse slide devices 27 and 28, which slide on the second transverse rail 24, are provided on the second transverse rail 24. Further, the first to third transverse slide devices 26, 27, and 28 are provided with first to third vertical bars 30, 31, and 32 that slide in the vertical direction, respectively. First to third robot chucks 33, 34, and 35 are provided at the lower portions of these first to third vertical bars 30, 31, and 32, respectively. In this exemplary embodiment, the first conveying device 14 includes the main rail 17, the first main slide device 20, the first transverse rail 23, the first transverse slide device 26, the first vertical bar 30, and the first robot chuck 33. The first conveying device 14 is shown in FIG. 3 when seen in the horizontal direction. The first conveying device 14 is formed of a device configured to convey four molded products 1 formed by the injection molding machine 4 to the temporary stage 12. The second conveying device 15 includes the main rail 17, the second main slide device 21, the second transverse rail 24, the second transverse slide device 27, the second vertical bar 31, and the second robot chuck 34. The second conveying device 15 is formed of a device configured to convey twelve molded products 1 pooled on the temporary stage 12 to the film forming device 5. Further, the third conveying device 16 includes the main rail 17, the second main slide device 21, the second transverse rail 24, the third transverse slide device 28, the third vertical bar 32, and the third robot chuck 35. The third conveying device 16 is formed of a device configured to convey twelve molded products 1 on which films have been formed by the film forming device 5 to the belt conveyor 18.

A method for manufacturing a molded product having a thin film by the apparatus 3 for manufacturing a molded product having a thin film according to this exemplary embodiment will be described. As known in the art, an injection molding step is performed in the injection molding machine 4 in order to form molded products 1. That is, the molds 7a and 7b are clamped, and a molten resin is injected into the molds from the injection device. When the molds 7a and 7b are opened after the molten resin is solidified by cooling, four molded products 1 are obtained. The obtained molded products 1 are taken out by the first conveying device 14, and are conveyed to the temporary stage 12. A second injection molding step is performed in the same way as described above, and molded products 1 are conveyed to the temporary stage 12 by the first conveying device 14 whenever an injection molding step is performed. When a third injection molding step is performed and molded products 1 are conveyed onto the temporary stage 12, twelve molded products 1 are pooled on the temporary stage 12. This state is schematically shown in FIG. 1.

Twelve molded products 1, which are pooled on the temporary stage 12, are conveyed to the film forming device 5 by the second conveying device 15. That is, the second conveying device 15 loads the molded products 1 onto the conveying stage 13 of the film forming device 5. The conveying stage 13 is driven, so that the twelve molded products 1 are conveyed to the film formation chamber of the film forming device 5. Since one minute has not passed after injection molding, the surface temperature of every molded product 1 is in the range of about 50 to 80° C. That is, it is ensured that the surface temperature of the molded product is 40° C. or more. Accordingly, the adsorption of moisture does not occur, so that a film forming step is not affected. A film forming step is performed as known in the art. That is, the film formation chamber is hermetically sealed, the vacuum source is driven to suck air, and an inert gas is supplied from the inert gas supply source so that an inert gas atmosphere with a pressure of about several to several tens Pa is formed in the film formation chamber. A voltage is applied to the target and the film formation stage, and electricity is discharged. Accordingly, a thin film is formed on each of the molded products 1. That is, molded products 1 having thin films are obtained.

After the completion of the film forming step, the film formation chamber is opened, the conveying stage 13 is driven, and the molded products 1 having thin films are moved to the outside of the film forming device 5. The molded products 1 having thin films are taken out and conveyed to the belt conveyor 18 by the third conveying device 16.

Incidentally, when the molded products 1 are conveyed to the film forming device 5 from the temporary stage 12 by the second conveying device 15, the molded products do not remain on the temporary stage 12. Subsequently, an injection molding step is repeatedly performed in the injection molding machine 4 in order to form molded products 1, and the molded products 1 are conveyed to the temporary stage 12 by the first conveying device 14. Accordingly, since an injection molding step and a film forming step can be performed in parallel, a film forming step is performed one time while an injection molding step is performed three times. Therefore, not only the injection molding machine 4 but also the film forming device 5 are continuously operated without substantially causing a waiting time.

This exemplary embodiment may have various modifications. For example, in this exemplary embodiment, a film forming step has been performed one time while an injection molding step is performed three times since the time for an injection molding step is 20 seconds and is one third of one minute that is required for a film forming step. However, when the time for an injection molding step is 10 seconds, a film forming step may be performed one time while an injection molding step is performed six times. Further, the second conveying device 15 has conveyed all the molded products 1 pooled on the temporary stage 12 to the film forming device 5. Alternatively, molded products to be conveyed may be limited to only molded products 1 for which a predetermined time has passed from the molding thereof and molded products having been just formed may remain on the temporary stage 12. In this case, remaining molded products 1 are conveyed to the film forming device 5 next time or later. Accordingly, the surface temperature of the molded product to be conveyed to the film forming device 5 falls in the range of 40 to 50° C. Such a temperature is a temperature where there is no concern about the adsorption of moisture and is also a temperature where the excessive temperature rise of the molded products 1 in the film forming step can be prevented.

What is claimed is:

1. An apparatus for manufacturing a molded product having a thin film, the apparatus comprising:

an injection molding machine configured to form the molded product; a first conveying device, a second conveying device and a third conveying device, which are configured to convey the molded product;

a film forming device configured to form a film on the molded product; said film forming device includes a chamber, a temporary stage configured to pool each molded product, wherein every shot of the injection molding machine, which is in the form of molded product, is conveyed to the temporary stage by the first conveying device, wherein a plurality of molded products, which are formed by a plurality of shots and pooled on the temporary stage, are conveyed to the film forming device by the second conveying device before the surface temperature of the molded product falls to 40° C. or less, and films are collectively formed on the molded products by the film forming device, and wherein the plurality of molded products, on which the films have been formed by the film forming device, are conveyed outside said chamber of the film forming device by the third conveying device; and a main rail disposed above the injection molding machine, the temporary stage, and the film forming device, and the first conveying device includes:

a first main slide device that slides along the main rail, a first transverse rail orthogonal to the main rail and fixed to the first main slide device, a first transverse slide device, which slides along the first transverse rail, and which is connected to a vertical bar having a chuck at a lower end thereof, wherein the first conveying device is configured to convey the molded product from the injection molding machine to the temporary stage by a sliding movement of the first main slide device, each time an injection molding step is completed by the injection molding machine, and said temporary stage is stationary relative to said first conveying device and said second conveying device.

* * * * *